United States Patent [19]

Reinschmidt

[11] Patent Number: 5,289,409
[45] Date of Patent: Feb. 22, 1994

[54] BIPOLAR TRANSISTOR MEMORY CELL AND METHOD

[75] Inventor: Robert M. Reinschmidt, Los Gatos, Calif.

[73] Assignee: Digital Equipment Corporation, Maynard, Mass.

[21] Appl. No.: 73,457

[22] Filed: Jun. 7, 1993

Related U.S. Application Data

[63] Continuation of Ser. No. 546,395, Jun. 29, 1990, abandoned.

[51] Int. Cl.⁵ .................. G11C 11/00; G11C 11/34
[52] U.S. Cl. .................. 365/154; 365/155; 365/156; 365/180; 365/225.6
[58] Field of Search .......... 365/154, 155, 156, 225.6, 365/180

[56] References Cited

U.S. PATENT DOCUMENTS

| | | | |
|---|---|---|---|
| 3,231,763 | 1/1966 | Mellott | 365/180 |
| 3,603,820 | 9/1971 | Schuenemann | |
| 3,863,229 | 1/1975 | Gersbach | 365/180 |
| 3,918,033 | 11/1975 | Case et al. | 365/174 |
| 4,138,739 | 2/1979 | Robinson | 365/174 |
| 4,287,575 | 9/1981 | Eardley et al. | 365/174 |
| 4,288,862 | 9/1981 | Ohhinath et al. | 365/181 |
| 4,297,598 | 10/1981 | Smith | 307/355 |
| 4,346,458 | 8/1982 | Berger et al. | 365/174 |
| 4,769,785 | 9/1988 | Guo | 365/155 |
| 4,858,181 | 8/1989 | Scharrer et al. | 365/155 |

FOREIGN PATENT DOCUMENTS 3012831 10/1980 Fed. Rep. of Germany.

OTHER PUBLICATIONS

IBM Technical Disclosure Bulletin, vol. 33, No. 18, Jun. 1990, pp. 328 and 329, "Dual-Port Bipolar Memory Cell With Soft Error Rate Immunity".
IBM Technical Disclosure Bulletin, vol. 30, No. 9, Feb. 1988, pp. 253 and 254, "Transistor Gated CTS Memory Cell".
IBM Technical Disclosure Bulletin, vol. 30, No. 2, Jul. 1987, pp. 504 and 505, "Current Sense Static Bipolar Random-Access Memory Cell".
IBM Technical Disclosure Bulletin, vol. 22, No. 6, Nov. 1979, pp. 2313 and 2314, "I²L/MTL Storage Cell".
Cavaliere et al., "Bipolar RAM Cell With Bilateral NPN Bitline Coupling Transistors" IBM Tech. Disc. Bull. vol. 20, No. 4, Sep. 1977, pp. 1447-1450.

Primary Examiner—Joseph L. Dixon
Assistant Examiner—Michael A. Whitfield
Attorney, Agent, or Firm—Denis G. Maloney; Albert P. Cefalo

[57] ABSTRACT

Bipolar transistor memory cell and method for use in a random access memory. A pair of state elements are cross coupled so that they assume opposite states in accordance with signals applied thereto, a pair of bipolar pass transistors are connected to respective ones of the state elements for applying signals to the state elements, and current flow through the pass transistors is monitored to determine the states of the state elements.

11 Claims, 2 Drawing Sheets

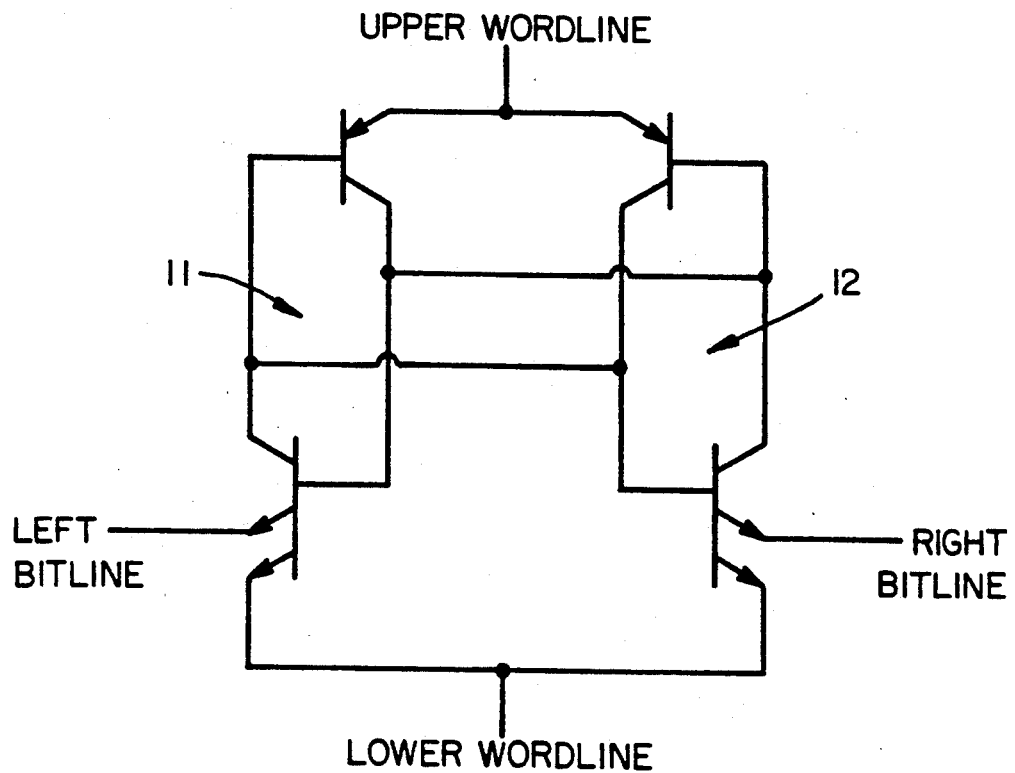
FIG_1
(PRIOR ART)

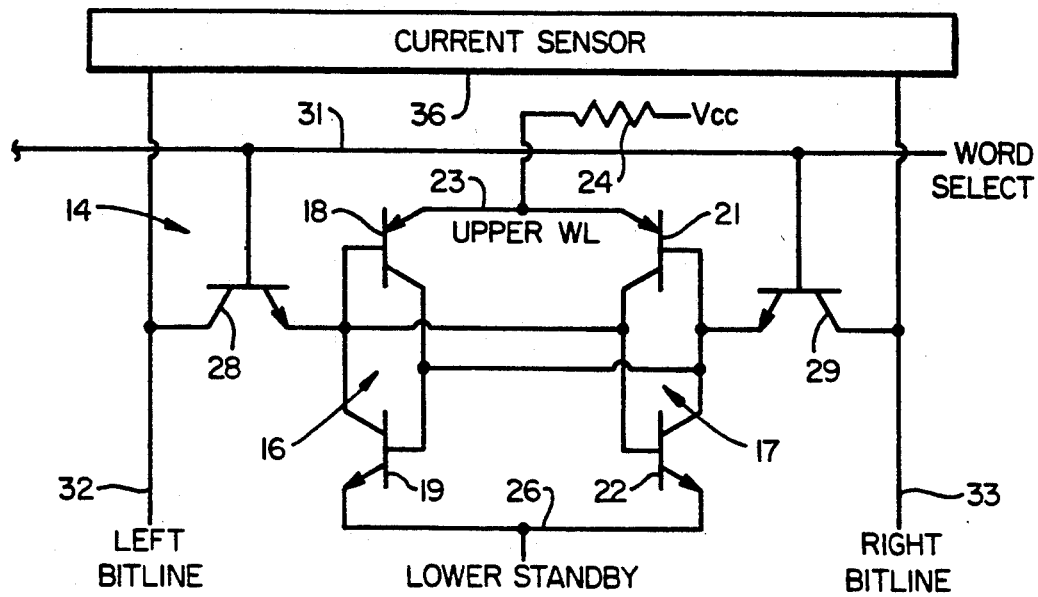
FIG_2
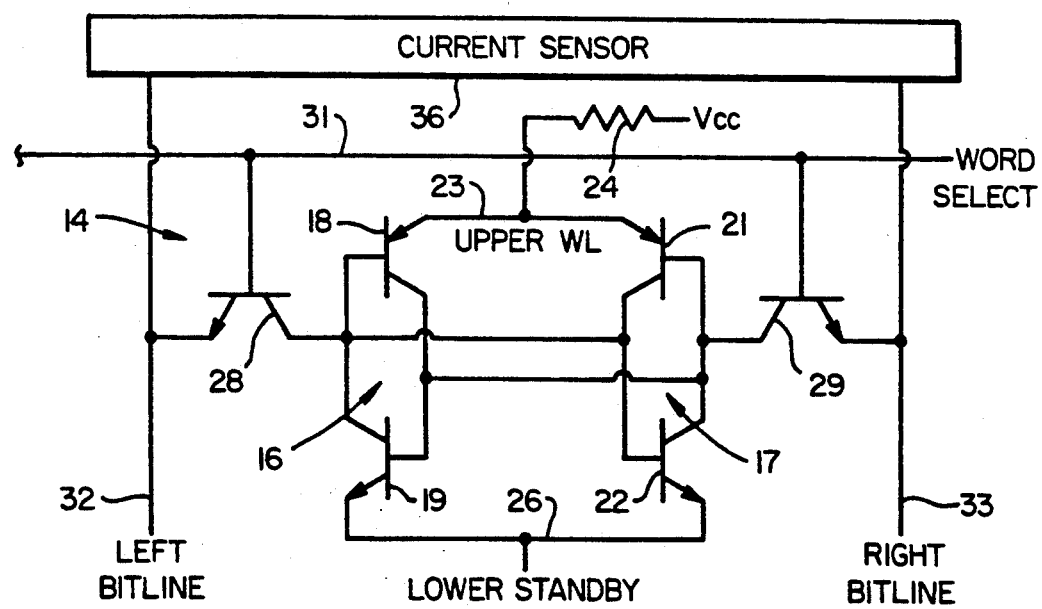
FIG_3

BIPOLAR TRANSISTOR MEMORY CELL AND METHOD

This is a continuation of application Ser. No. 07/546,395, filed Jun. 29, 1990, now abandoned.

BACKGROUND OF INVENTION

This invention pertains generally to memory devices for high speed digital computers and the like and, more particularly, to a bipolar transistor memory cell and method for use in a random access memory.

Three types of random access memory cells are commonly utilized to provide high speed operation with bipolar peripheral circuits. These include emitter coupled SCR (silicon controlled rectifier) cells, switched collector load cells, and 6 transistor CMOS cells.

A standard SCR memory cell is illustrated in FIG. 1. This cell has a pair of cross coupled SCR circuits 11, 12 which hold the state of the cell Cells of this type are commonly employed in memory arrays in which a number of similar cells are organized by rows representing data words and columns representing individual bits within the words, with the left and right bitlines for a column being connected directly to the emitters of the transistors in the SCR circuits.

The standard SCR memory cell has certain limitations and disadvantages. It requires a deep base implant, which requires a relatively complex fabrication process. Inverse leakage reduces the standby current in the cell and causes an unbalancing of bitline currents, which results in soft error sensitivity, low yield and slower access times.

The invention provides a new and improved bipolar transistor memory cell and method in which a pair of state elements are cross coupled so that they assume opposite states in accordance with signals applied thereto, a pair of bipolar pass transistors are connected to respective ones of the state elements for applying signals to the state elements, and current flow through the pass transistors is monitored to determine the states of the state elements.

BRIEF DESCRIPTION OF THE DRAWINGS

FIG. 1 is a circuit diagram of a prior art emitter coupled SCR memory circuit.

FIG. 2 is a circuit diagram of one embodiment of a bipolar transistor memory cell according to the invention.

FIG. 3 is a circuit diagram of another embodiment of a bipolar transistor memory cell according to the invention.

DETAILED DESCRIPTION OF THE PREFERRED EMBODIMENT

As illustrated in FIG. 2, the memory cell 14 has a pair of cross coupled state elements 16, 17 in the form of SCR circuits which assume opposite output states in response to the signals applied thereto. SCR circuit 16 comprises a PNP transistor 18 and an NPN transistor 19, with the collector of the PNP transistor being connected to the base of the NPN transistor, and the collector of the NPN transistor being connected to the base of the PNP transistor. SCR circuit 17 comprises a PNP transistor 21 and an NPN transistor 22, with the collector of the PNP transistor being connected to the base of the NPN transistor, and the collector of the NPN transistor being connected to the base of the PNP transistor.

The emitters of the PNP transistors are connected to an upper wordline node 23, which is connected to a positive supply voltage $V_{CC}$ by a resistor 24. The emitters of the NPN transistors are connected to a lower standby node 26 to which a standby current is applied. The upper wordline node is common to all of the cells in a row, and the lower standby node is common to all of the cells in an array.

The SCR circuits are cross coupled in that the base of the PNP transistor in SCR 16 is connected to the base of the NPN transistor in SCR 17, and the base of the PNP transistor in SCR 17 is connected to the base of the NPN transistor in SCR 16. Thus, when one of the SCR circuits is in its OFF state, the other will be in its ON state.

A pair of pass transistors 28, 29 are connected to the SCR circuits in the cell. In the embodiment illustrated, the pass transistors are NPN transistors with their emitters connected to the bases of the transistors in the SCR circuits. Thus, the emitter of pass transistor 28 is connected to the bases of transistors 18, 22 in the SCR circuits, and the emitter of pass transistor 29 is connected to the bases of transistors 19, 21. The bases of the pass transistors are connected to one of the word select nodes 31 in the memory array, and the collectors of these transistors are connected to the left and right bitlines, 32, 33 for one column of the array.

A current sensor 36 is connected to the pass transistors to monitor the current flow in these transistors and thereby determine the state of the cell. Suitable sensors include a cascode bitline current sensor or a differential current mirror the latter being preferred. With either of these sensors, the bitline voltage swing in the read mode is small (e.g., 100 mv or less), which permits a fast access time.

A plurality of memory cells similar to cell 14 are arranged in a rectangular array to form a random access memory. The memory has separate upper wordlines and word select lines for each row in the array, a pair of left and right bitlines for every column in the array, and a lower standby node which is common to every cell in the array.

A row of cells is selected for a read operation or a write operation by placing a high voltage signal on the upper wordline select node for the row, e.g. node 31. When a row is selected, all of the cells in the row will have one pass transistor conducting, and current will flow through the left or right pass transistors of the respective cells depending upon the states of the cells. With only one row in the array selected at a time, only one cell is selected for each column, and since only one pass transistor will be conducting in each cell, the difference in current flowing into the left and right bitlines will indicate the state of the selected memory cell, i.e. the cell at the intersection of the selected row and the selected column.

The cells in the unselected rows have a low voltage applied to their wordline select nodes, and all pass transistors in the unselected cells are in the off mode.

In the read mode, voltages are applied to the bitlines such that one of the pass transistors in the selected cell is in a forward active mode and the other pass transistor in that cell is in the off mode.

Data is written into a selected cell by lowering the voltage on the left or right bitline for column in which the cell is located, depending upon the state to be written. When the bitline is lowered sufficiently, the pass transistor of the selected cell will conduct in the inverse mode to write the cell.

The memory cell with the pass transistors has a number of advantages over the standard ECL memory cell illustrated in FIG. 1. The word select voltage swing is low (e.g., 400 mv or less), which permits a fast access time, as does a cascode bitline current sensor or a differential current mirror sensor. Selecting the cell for a read operation does not increase the currents in the PNP transistors and therefore does not significantly increase the diffusion capacitance of the cell. This permits a fast write time. The voltage swings in the circuit are relatively low, which means that the cell can operate at a reduced supply voltage (e.g., 4.0 volts or less), with less power dissipation. Deselected cells have no forward conduction in their base-collector junctions and no inverse leakage to reduce the standby current and unbalance the bitline currents, which can result in sensitivity to soft errors, low yield and slower access times. Without inverse leakage, the cell can operated at higher standby currents, with increased immunity to soft errors. Also, there is no need for a deep base implant to reduce inverse leakage, which means that the cell can be fabricated with a simpler and less expensive process.

The pass transistor cell is somewhat larger than a standard emitter coupled cell. However, it requires fewer transistors in the peripheral circuitry than a standard cell, with the result that at the 2K bit level, a RAM using the pass transistor cells occupies about the same chip area as a RAM with standard cells.

The following table summarizes the comparative data for 4K×18 RAM's configured from 36 blocks of 2K×1 using standard SCR cells and the pass transistor cell of the invention:

|  | Std. Cell | Pass Cell |
| --- | --- | --- |
| Read Cycle Time | 3.2 ns | 2.5 ns |
| Write Cycle Time | 5.0 ns | 5.0 ns |
| Write Recovery Time | 5.0 ns | 1.0 ns |
| Cell Size | 255 microns² | 255 microns² |
| Die Area | .67 cm² | .67 cm² |

The embodiment of FIG. 3 is similar to the embodiment of FIG. 2, and like reference numerals designate corresponding elements in the two embodiments. In the embodiment of FIG. 3, however, the pass transistors 28, 29 have their emitters connected to the bitlines 32, 33 and their collectors connected to the bases of the transistors in the SCR circuits. These transistors, thus, operate in a reverse or inverse pass mode rather than in a forward pass mode as in the embodiment of FIG. 2.

The reverse pass cell has one advantage over the forward pass cell in that it has only two collectors, compared with four such regions in the forward pass cell, which means that the reverse pass cell can be made smaller and will occupy less chip area than the forward pass cell. However, the read access time is not as fast as with the forward pass cell because of the slower characteristics of the pass transistors in the reverse mode.

It is apparent from the foregoing that a new and improved bipolar transistor memory cell and method have been provided. While only certain presently preferred embodiments have been described in detail, as will be apparent to those familiar with the art, certain changes and modifications can be made without departing from the scope of the invention as defined by the following claims.

I claim:

1. A bipolar transistor memory cell for use in a memory array having a word select line and a pair of bit select lines, comprising: a pair of cross coupled silicon controlled rectifiers which assume opposite states in accordance with signals applied thereto, a pair of bipolar pass transistors connected to the silicon controlled rectifiers and adapted for connection to the bit lines, and means for applying signals from the word select line to the pass transistors to control communication between the silicon controlled rectifiers and the bit lines.

2. The memory cell of claim 1 wherein the pass transistors have emitters connected to the silicon controlled rectifiers, bases adapted for connection to the word select line, and collectors adapted for connection to the bit lines.

3. The memory cell of claim 1 wherein the pass transistors have collectors connected to the silicon controlled rectifiers, bases adapted for connection to the word select line, and emitters adapted for connection to the bit lines.

4. The memory cell of claim 1 including means for monitoring current flow through the pass transistors to determine the states of the silicon controlled rectifiers.

5. A bipolar transistor memory cell for use in a memory array having word select lines and bit select lines, comprising: a pair of cross coupled silicon controlled rectifiers which assume opposite states in accordance with signals applied thereto, a pair of bipolar pass transistors each having one of its emitter and collector elements connected to a respective one of the silicon controlled rectifiers, means for connecting the other of said emitter and collector elements to a bit select line in the memory array, and means for connecting the bases of the pass transistors to a word select line in the memory array.

6. A bipolar transistor memory, comprising:
a plurality of word select lines,
a plurality of bit select lines,
a plurality of memory cells each having
a pair of cross coupled silicon controlled rectifiers which assume opposite states in accordance with signals applied thereto and
a pair of bipolar pass transistors each having one of its emitter and collector elements connected to a respective one of the silicon controlled rectifiers, the other of said emitter and collector elements connected to one of the bit select lines, and its base connected to one of the word select lines, and
means for monitoring current flow through the pass transistors to determine the states of the silicon controlled rectifiers in individual ones of the memory cells.

7. A method of writing/reading data in a bipolar transistor memory cell in a memory array having a word select line and a pair of bit lines, said memory cell having a pair of cross coupled silicon controlled rectifiers which assume opposite states in accordance with signals applied thereto, comprising the steps of: connecting a pair of bipolar pass transistors between the silicon controlled rectifiers and the bit lines, and applying word select signals to the pass transistors to control communication between the silicon controlled rectifiers and the bit lines.

8. The method of claim 7 wherein the emitters of the pass transistors are connected to the silicon controlled rectifiers, the collectors of the pass transistors are connected to the bit lines, and the word select signals are applied to the bases of the pass transistors.

9. The method of claim 7 wherein the collectors of the pass transistors are connected to the silicon controlled rectifiers, the emitters of the pass transistors are connected to the bit lines, and the word select signals are applied to the bases of the pass transistors.

10. The method of claim 7 including the step of monitoring current flow through the pass transistors to determine the states of the silicon controlled rectifiers.

11. A method of writing/reading data in a bipolar transistor memory cell having a pair of silicon controlled rectifiers which assume opposite states in accordance with signals applied thereto, comprising the steps of: applying signals to the silicon controlled rectifiers through pass transistors, each of said pass transistors having one of its emitter and collector elements connected to the respective silicon controlled rectifier, applying bit select signals to the other of the emitter and collector elements, and applying word select signals to the bases of the pass transistors.

* * * * *